United States Patent
LaCroix et al.

(10) Patent No.: US 8,999,846 B2
(45) Date of Patent: Apr. 7, 2015

(54) ELONGATED VIA STRUCTURES

(71) Applicant: International Business Machines Corporation, Armonk, NY (US)

(72) Inventors: Luke D. LaCroix, Williston, VT (US); Mark C. H. Lamorey, South Burlington, VT (US); Janak G. Patel, South Burlington, VT (US); Peter Slota, Jr., Vestal, NY (US); David B. Stone, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/255,037

(22) Filed: Apr. 17, 2014

(65) Prior Publication Data

US 2014/0227874 A1  Aug. 14, 2014

Related U.S. Application Data

(62) Division of application No. 13/459,785, filed on Apr. 30, 2012, now Pat. No. 8,759,977.

(51) Int. Cl.
*H01L 21/311* (2006.01)
*H01L 21/768* (2006.01)
(Continued)

(52) U.S. Cl.
CPC .......... *H01L 21/768* (2013.01); *H01L 23/5226* (2013.01); *H01L 23/5283* (2013.01)

(58) Field of Classification Search
USPC ......... 438/700, 270, 672, 675, 679, 682, 683, 438/684, 685, 786, 787, 791; 257/E21.006, 257/E21.17, E21.165, E21.267, E21.278, 257/E21.293, E21.095, E21.585
See application file for complete search history.

(56) References Cited

U.S. PATENT DOCUMENTS

| 6,252,266 B1 | 6/2001 | Hoshi et al. |
| 6,531,766 B1 | 3/2003 | Taniguchi et al. |

(Continued)

FOREIGN PATENT DOCUMENTS

| JP | 2000151111 | 5/2000 |
| JP | 2001337440 | 12/2001 |

(Continued)

OTHER PUBLICATIONS

Office Action Communication, U.S. Appl. No. 13/459,785, Oct. 15, 2013, pp. 1-6.

(Continued)

*Primary Examiner* — David Nhu
(74) *Attorney, Agent, or Firm* — Gibb & Riley, LLC; David A. Cain, Esq.

(57) ABSTRACT

An integrated circuit structure includes a plurality of insulator layers (connected to each other) that form a laminated structure. Further included are via openings within each of the insulator layers, and conductive via material within the via openings. The conductive via material within corresponding via openings of adjacent insulator layers are electrically connected to form continuous electrical via paths through the insulator layers between the top surface and the bottom surface of the laminated structure. Within each of the continuous electrical via paths, the via openings are positioned relative to each other to form a diagonal structural path of the conductive via material through the laminated structure. The corresponding via openings of the adjacent insulator layers partially overlap each other. The diagonal structural paths are non-perpendicular to the top surface and the bottom surface.

18 Claims, 5 Drawing Sheets

(51) Int. Cl.
*H01L 23/522* (2006.01)
*H01L 23/528* (2006.01)

(56) References Cited

U.S. PATENT DOCUMENTS

| | | | |
|---|---|---|---|
| 6,724,083 | B2 | 4/2004 | Ohuchi et al. |
| 6,751,101 | B2 | 6/2004 | Sakai |
| 6,882,026 | B2 | 4/2005 | Shirakawa |
| 7,622,759 | B2 | 11/2009 | Park |
| 7,906,436 | B2 | 3/2011 | Konishi |
| 8,445,329 | B2 | 5/2013 | Leung et al. |
| 8,759,977 | B2 * | 6/2014 | LaCroix et al. ............... 257/769 |
| 2008/0191345 | A1 | 8/2008 | Na et al. |

FOREIGN PATENT DOCUMENTS

| | | |
|---|---|---|
| JP | 2003304002 | 10/2003 |
| JP | 2010212326 | 9/2010 |
| JP | 2011040670 | 2/2011 |

OTHER PUBLICATIONS

Office Action Communication, U.S. Appl. No. 13/459,785, Nov. 13, 2013, pp. 1-9.

Notice of Allowance Communication, U.S. Appl. No. 13/459,785, Jan. 28, 2014, pp. 1-7.

* cited by examiner

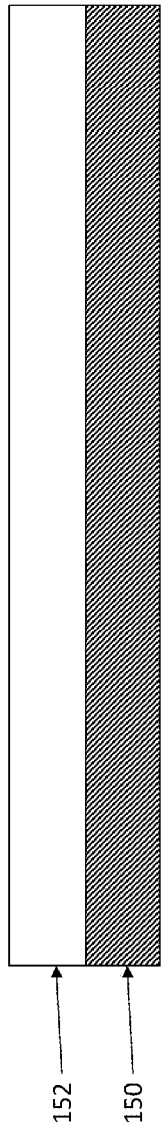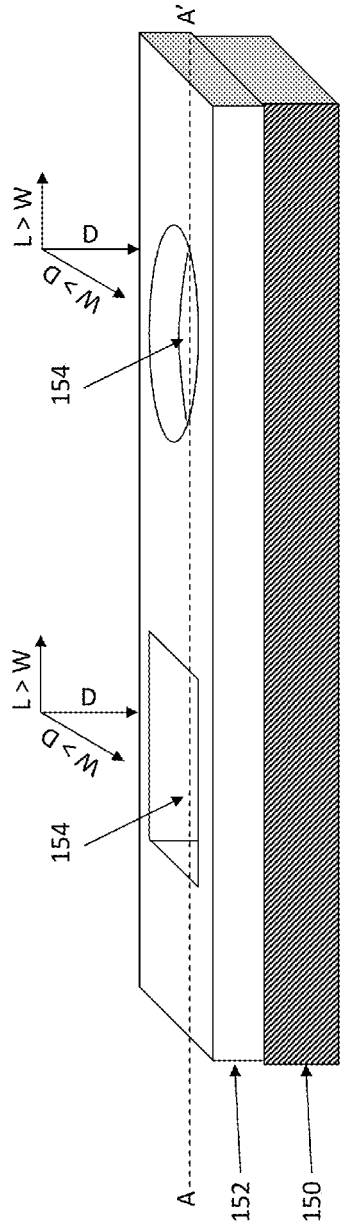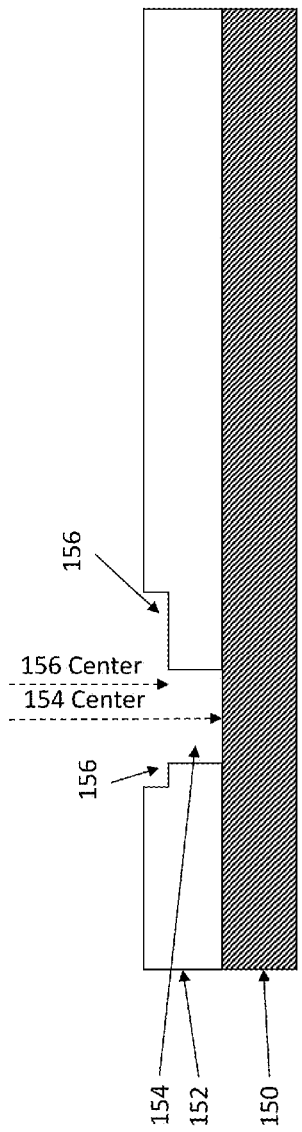

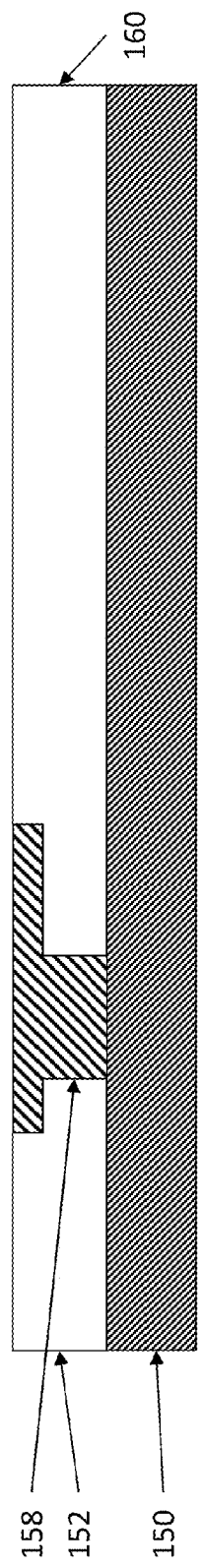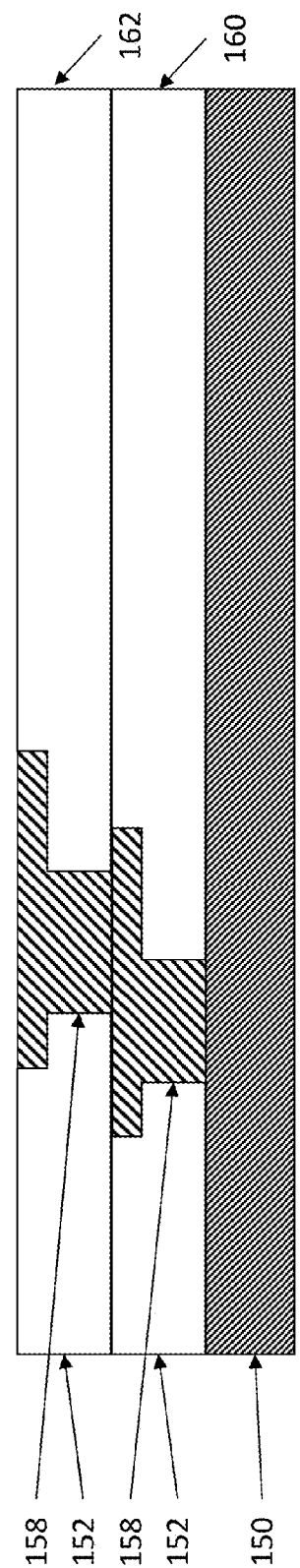

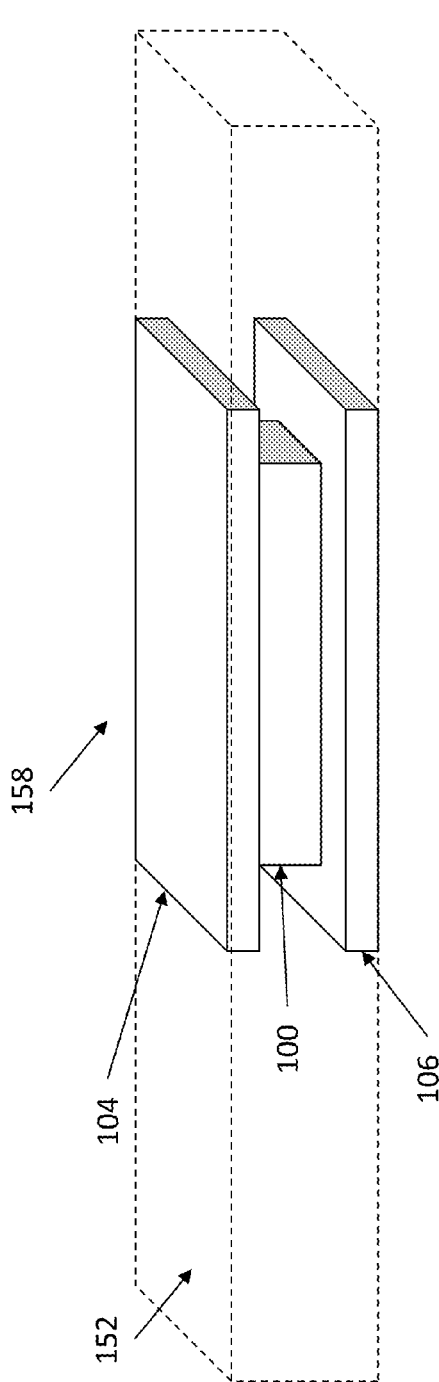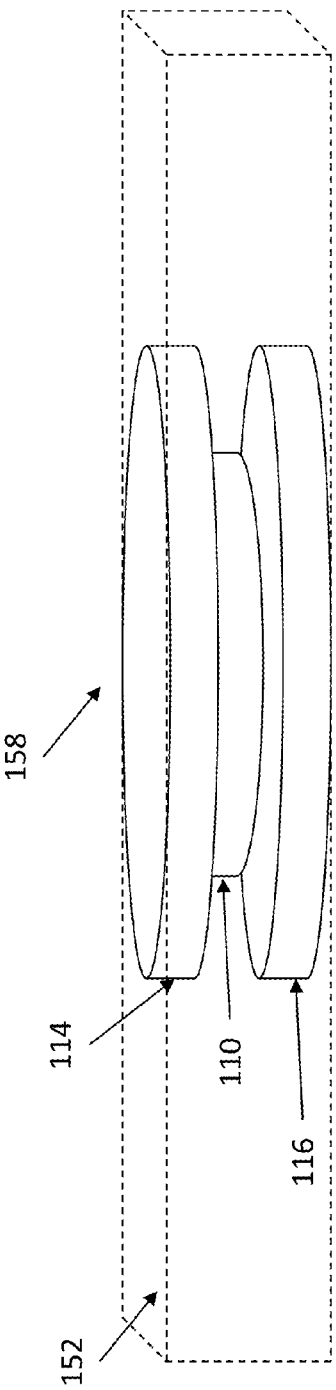

ELONGATED VIA STRUCTURES

CROSS-REFERENCE TO RELATED APPLICATIONS

This application is a divisional of U.S. patent application Ser. No. 13/459,785, filed Apr. 30, 2012, U.S. Pat. No. 8,759,977 B2 the complete disclosure of which is incorporated herein by reference.

BACKGROUND

The present disclosure relates to laminated integrated circuit structures, and more specifically to laminated structures that use conductive vias.

Within integrated circuit devices, stresses on laminated structures caused during module assembly or by large thermal gradients, can result in deformation, deflection, or warping of laminate. The effects of the laminate warping are found, for example, during chip assembly processes as it causes open connections between the chip and the laminate. The laminate warping also contributes to module co-planarity. This causes yield loss during card assembly. There are various ways to control the laminate warping, such as appropriate laminate materials selection, selecting appropriate laminate fabrication processes, employing mechanical fixtures during assembly, etc. In some situations, above various ways may not be enough to control laminate warping, and could potentially increase production costs.

SUMMARY

According to one embodiment herein, an integrated circuit structure comprises a plurality of insulator layers (connected to each other) that form a laminated structure. Further included are via openings within each of the insulator layers, and conductive via material within the via openings. The laminated structure has a top surface and a bottom surface opposite the top surface (the insulator layers are between the top surface and the bottom surface of the laminated structure).

The conductive via material within corresponding via openings of adjacent insulator layers are electrically connected to form continuous electrical via paths through the insulator layers between the top surface and the bottom surface of the laminated structure. Within each of the continuous electrical via paths, the via openings are positioned relative to each other to form a diagonal structural path of the conductive via material through the laminated structure. The corresponding via openings of the adjacent insulator layers partially overlap each other. The diagonal structural paths are non-perpendicular to the top surface and the bottom surface.

According to another embodiment herein, an integrated circuit structure comprises a plurality of insulator layers (connected to each other) that form a laminated structure. Further included are via openings within each of the insulator layers, and conductive via material within the via openings. The laminated structure has a top surface and a bottom surface opposite the top surface (the insulator layers are between the top surface and the bottom surface of the laminated structure).

The conductive via material within corresponding via openings of adjacent insulator layers are electrically connected to form continuous electrical via paths through the insulator layers between the top surface and the bottom surface of the laminated structure. Within each of the continuous electrical via paths, the via openings are positioned relative to each other to form a diagonal structural path of the conductive via material through the laminated structure. The corresponding via openings of the adjacent insulator layers partially overlap each other. The diagonal structural paths are non-perpendicular to the top surface and the bottom surface.

Each of the via openings has three perpendicular dimensions including a depth dimension equal to a thickness of one of the insulator layers, a width dimension greater than the depth dimension, and a length dimension greater than the width dimension. Each of the via openings comprises a first opening portion and a second opening portion. The first opening portion extends fully through a corresponding one of the insulator layers and the second opening portion extends partially through the corresponding one of the insulator layers. Further, the length dimension of the second opening portion is greater than the length dimension of the first opening, and the width dimension of the second opening portion is greater than the width dimension of the first opening.

Exemplary method embodiments herein form an integrated circuit structure by forming via openings in an insulator layer, and forming conductive via material within the via openings. The methods eventually form a laminated structure of additional similar insulator layers on the first insulator layer. More specifically, the methods form the laminated structure by successively forming the insulator layers on one another. Thus, this includes repeating the processes of forming the via openings in each the insulator layers, positioning corresponding ones of the via openings of the adjacent insulator layers to partially overlap each other, and repeating the process of forming the conductive via material in the via openings. The laminated structure is thus formed to have a top surface and a bottom surface opposite the top surface, where the insulator layers are formed between the top surface and the bottom surface of the laminated structure.

The process of repeatedly forming the conductive via material in the via openings electrically connects the conductive via material within the corresponding via openings to form continuous electrical via paths through the insulator layers between the top surface and the bottom surface of the laminated structure. The positioning of the corresponding via openings to only partially overlap each other within each of the continuous electrical via paths causes the process of forming the conductive via material to form a diagonal structural path of the conductive via material through the laminated structure. This diagonal structural path is therefore formed non-perpendicular to the top surface and the bottom surface.

Other exemplary methods form a different integrated circuit structure where each of the via openings are elongated, and therefore have three unequal perpendicular dimensions. Such methods thus form the plurality of via openings by, for each of the via openings, forming a first opening portion in the insulator layer, where the first opening portion extends fully through the insulator layer. The three unequal dimensions of the first opening are the depth dimension that is equal to a thickness of the insulator layer, the width dimension that is greater than the depth dimension, and the length dimension that is greater than the width dimension.

These methods can also form, for each of the via openings, a second opening portion that extends only partially through the insulator layer. The second opening portion is formed to be overlapped with, and offset from a center of the first opening portion. Further, the length dimension of the second opening portion is formed greater than the length dimension of the first opening, and the width dimension of the second opening portion is formed greater than the width dimension of the first opening.

The methods again form conductive via material within the via openings, and the methods eventually form a laminated structure of additional similar insulator layers on the first insulator layer. As described above, such methods form the laminated structure by successively forming the insulator layers on one another. Thus, this includes repeating the processes of forming the first and second via openings in each the insulator layers, positioning corresponding ones of the via openings of the adjacent insulator layers to partially overlap each other, and repeating the process of forming the conductive via material in the via openings. The laminated structure is thus formed to have a top surface and a bottom surface opposite the top surface, where the insulator layers are formed between the top surface and the bottom surface of the laminated structure.

Again, the process of repeatedly forming the conductive via material in the via openings electrically connects the conductive via material within the corresponding via openings to form continuous electrical via paths through the insulator layers between the top surface and the bottom surface of the laminated structure. The positioning of the corresponding via openings to only partially overlap each other within each of the continuous electrical via paths causes the process of forming the conductive via material to form a diagonal structural path of the conductive via material through the laminated structure. This diagonal structural path is therefore formed non-perpendicular to the top surface and the bottom surface.

BRIEF DESCRIPTION OF THE DRAWINGS

The embodiments herein will be better understood from the following detailed description with reference to the drawings, which are not necessarily drawing to scale and in which:

FIG. 1 is a cross-sectional schematic diagram illustrating an integrated circuit structure according to embodiments herein;

FIG. 2 is a perspective-view schematic diagram illustrating an integrated circuit structure according to embodiments herein;

FIG. 3 is a cross-sectional schematic diagram illustrating an integrated circuit structure according to embodiments herein;

FIG. 4 is a cross-sectional schematic diagram illustrating an integrated circuit structure according to embodiments herein;

FIG. 5 is a cross-sectional schematic diagram illustrating an integrated circuit structure according to embodiments herein;

FIG. 9 is a perspective-view schematic diagram illustrating an integrated circuit structure according to embodiments herein; and FIG. 10 is a perspective-view schematic diagram illustrating an integrated circuit structure according to embodiments herein.

DETAILED DESCRIPTION

Figure 6:
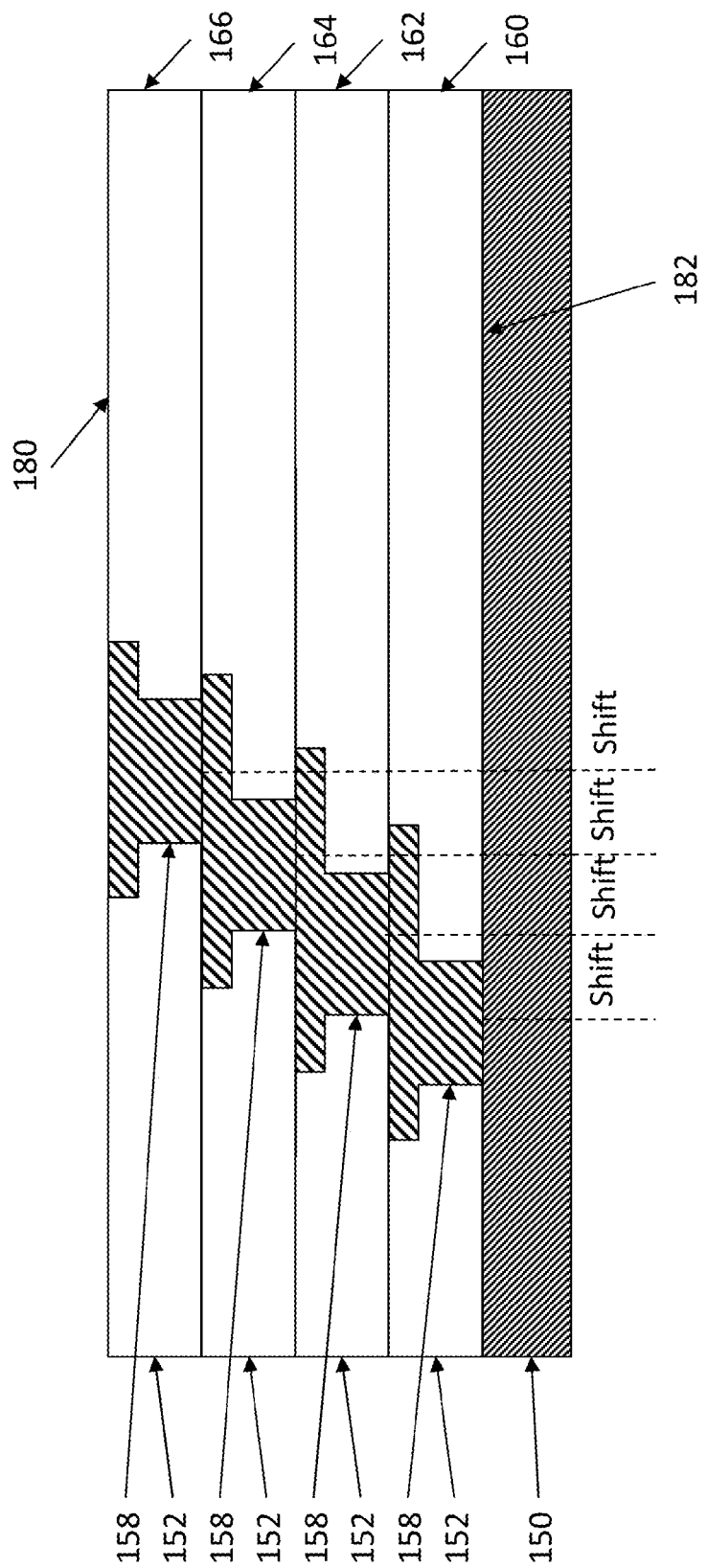
FIG. 6 is a cross-sectional schematic diagram illustrating an integrated circuit structure according to embodiments herein.

In view of the issues discussed above, various exemplary methods herein form different integrated circuit structures, where each of the via openings are elongated, and therefore have three unequal perpendicular dimensions. The three unequal dimensions of the via openings are the depth dimension that is equal to a thickness of the insulator layer, the width dimension that is greater than the depth dimension, and the length dimension that is greater than the width dimension.

Therefore, as shown in FIG. 1, such methods thus form an insulator layer 152 on a structure, such as a flip chip or any other integrated circuit structure 150. For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

Next a plurality of via openings are formed, two of which shown in FIG. 2 and are identified as item 154. All via openings discussed herein can be square, rounded, oval, square with rounded corners, etc. Further, as would be understood by those ordinarily skilled in the art, the vias could be formed into any complex via shape depending upon the number of different etching and masking steps one desires to engage. One example of a complex via shape being a rectangle via shape at the opening, where the rectangle shape extends partially through the insulator thickness, and then the via shape becomes an elongated oval shape through the rest of insulator thickness. Many other complex shapes could be used. In order to simplify the remaining drawings only one of the many openings is illustrated, but those ordinarily skilled in the art would understand that many series of via openings would be formed, and that such openings could be of any geometric shape that is required by the specific situation and specific structure. Further, as shown by the arrows in FIG. 2, the three unequal dimensions of the via openings are shown as the depth dimension D (that is equal to a thickness of the insulator layer 152), the width dimension W (that is greater than the depth dimension D), and the length dimension L (that is greater than the width dimension W).

FIGS. 1 and 3-6 are cross-sectional drawings along line A-A' in FIG. 2. In FIGS. 3-6, an optional stepped opening that includes a lower (or "first") opening 154 and a larger upper (or "second") opening 156 is shown. In other embodiments, a simple non-stepped opening 154 could be formed. The via opening (or first opening portion) 154 extends fully through the insulator layer 152.

If the stepped opening is to be formed, the second opening portion 156 is then formed in a subsequent process to extend only partially through the insulator layer 152, to form a step at the top of the via opening. Further, the length dimension of the second opening portion 156 is formed greater than the length dimension of the first opening 154, and the width dimension of the second opening portion 156 is formed greater than the width dimension of the first opening 154.

Note that as shown by the dashed arrows in FIG. 3, the second opening portion 156 is formed to overlap, but be offset from the center of the first opening portion 154. In other words, the first opening portion 154 and the second opening portion 156 combine to form a continuous, stepped opening; however, the center of the first opening portion 154 is different than (offset from) the center of the second opening portion 156 (as shown by the dashed arrows). Therefore, the step on one end of the opening is not equal in length to the step on the other end of the opening (when viewing along the length of the opening portions 154, 156), as shown in FIG. 3. The methods herein form one or both openings 154, 156 using any conventional techniques, such as masking and etching, laser etching, etc. Therefore, in one example, the insulator material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, reactive ion etching, etc.) to remove the unprotected portions of the material to be patterned. The resist is subsequently removed to leave the underlying insulator material patterned according to the light exposure pattern.

Once one or both via opening portions 154, 156 are patterned, the methods herein forms conductive via material 158 within the via openings 154, 156, as shown in FIG. 4. While copper can be used to provide good structural support, the conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

As shown in FIGS. 5 and 6, the methods herein form a laminated structure of additional similar insulator layers 162, 164, 166, etc., on the first insulator layer 160. As described above, such methods form the laminated structure by successively forming the insulator layers 152 on one another. Thus, this includes repeating the processes of forming the first and optional second via openings 154, 156 in each the insulator layers 152, positioning corresponding ones of the via openings 154, 156 of the adjacent insulator layers 152 to partially overlap each other, and repeating the process of forming the conductive via material 158 in the via openings 154, 156. Because the via openings are shifted in position with respect to one another from layer to layer, they overlap, but are not exactly aligned. Instead, the center of each via opening (shown by dashed lines in FIG. 6) is shifted over a specific equal amount (shown as a "shift" in FIG. 6) to cause a diagonally shifted metal structure to be formed.

Figure 7:
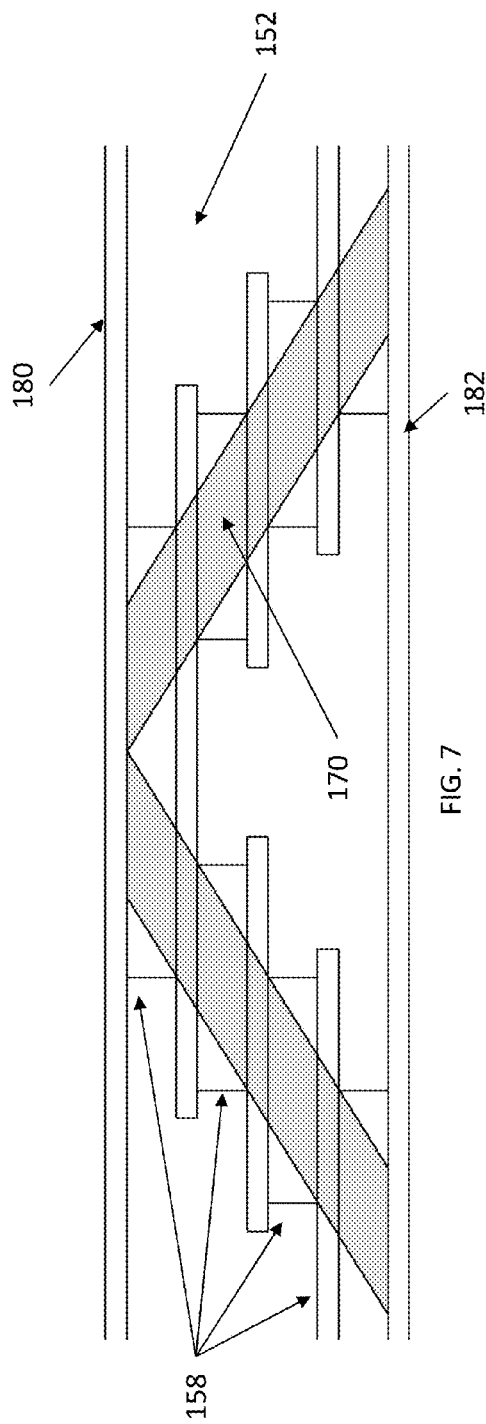
FIG. 7 is a cross-sectional schematic diagram illustrating an integrated circuit structure according to embodiments herein.

The laminated structure is thus formed to have a top surface 180 and a bottom surface 182 opposite the top surface, where the insulator layers 152 are formed between the top surface 180 and the bottom surface 182 of the laminated structure. Again, the process of repeatedly forming the conductive via material 158 in the via openings 154, 156 electrically connects the conductive via material 158 within the corresponding via openings 154, 156 to form continuous electrical via paths through the insulator layers 152 between the top surface 180 and the bottom surface 182 of the laminated structure. The positioning of the corresponding via openings 154, 156 to only partially overlap each other within each of the continuous electrical via paths causes the process of forming the conductive via material 158 to form a diagonal structural path 170 of the conductive via material 158 through the laminated structure, as shown in FIG. 7. This diagonal structural path 170 is therefore formed non-perpendicular to the top surface 180 and the bottom surface 182. However, note that the insulator layers 152 are formed parallel to the top surface and the bottom surface.

Figure 8:
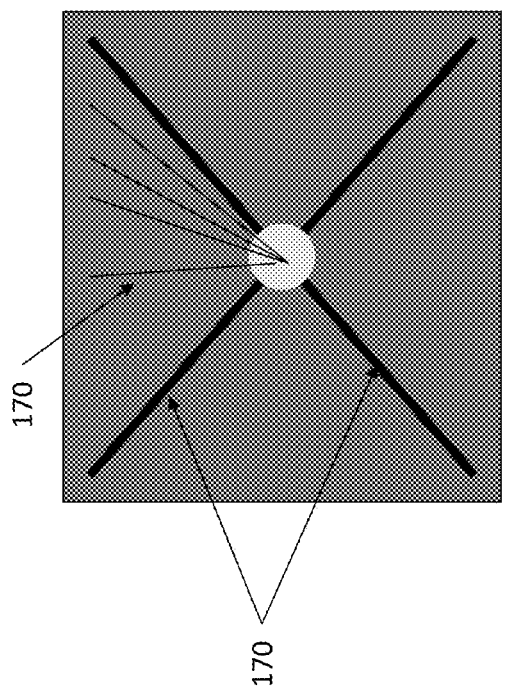
FIG. 8 is a top-view schematic diagram illustrating an integrated circuit structure according to embodiments herein.

As further shown in FIG. 7, these methods can form multiple such diagonal structural paths 170 to form, for example triangular load-bearing truss structures with either the top surface 180 or the bottom surface 182. In FIG. 7, the bottom surface 182 completes the triangular load-bearing structure with the two diagonal structural paths 170. Many such triangular load-bearing structures can be combined to form a truss that prevents the laminated structure from warping and delaminating. FIG. 8 is a top view showing that such triangular load-bearing structures 170 can be formed in any pattern that adds strength to the laminated structure.

FIGS. 9 and 10 illustrate that if the via openings are formed to include a step (formed to include both a first opening portion 154 and a second opening portion 156), a conductive structure 158 having a "T" or "I" shape in cross-section can be formed. FIG. 9 represents a structure formed with square openings, while FIG. 10 represents a structure formed with rounded openings. Because of the stepped openings formed in each successive insulator layer 152, a conductive structure 158 having a wider and longer top 104 and 114 and wider and longer bottom 106, 116 corresponding to the second opening portion 156 (relative to a more narrow and less lengthy core 100, 110 corresponding to the first opening portion 154) is formed. This "T" or "I" shape in cross-section provides additional structural support, again adding support to the truss structure 170 and helping to prevent the laminated structure from warping and delaminating. This also provides a flatter surface that experiences less shape change during thermal excursions.

Therefore, as shown above, these methods and structures use elongated via openings to form structural members 158 that resemble an I-beam to provide stiffness and a stronger structure. As shown above, the elongated vias 158 are arranged in such a way to form a truss structure of I-beams 170, which is the basic building block to prevent buckling or reduce warping in the laminate. The elongated via chain 170 is formed in such as way that elongated via 158 on each adjacent layer is overlapped and thereby forms a strong truss structure 170. This truss structure 170 can, for example, be formed in the top build up layers of a flip chip organic plastic ball grid array package 150 as well as in the bottom build up layers in a same fashion. Forming such a truss 170 within the laminate at strategic locations helps reduce warping at known locations of laminate where the possibility of maximum laminate warping could occur.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments.

The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an integrated circuit structure comprising:
    forming via openings in an insulator layer;
    forming conductive via material within said via openings; and
    forming a laminated structure of insulator layers on said insulator layer, said forming of said laminated structure of insulator layers comprising:
        successively forming said insulator layers on one another;
        repeating said forming of said via openings in each said insulator layers;
        positioning corresponding ones of via openings of adjacent ones of said insulator layers to partially overlap each other; and
        repeating said forming of said conductive via material in said via openings,
    said laminated structure of insulated layers being formed to have a top surface and a bottom surface opposite said top surface,
    said insulator layers being formed between said top surface and said bottom surface of said laminated structure of insulator layers,
    said repeating of said forming of said conductive via material in said via openings electrically connecting said conductive via material within said corresponding ones of said via openings to form continuous electrical via paths through said insulator layers between said top surface and said bottom surface of said laminated structure of insulator layers,
    said positioning of said corresponding ones of via openings within each of said continuous electrical via paths causing said forming of said conductive via material to form a diagonal structural path of said conductive via material through said laminated structure of insulator layers, and
    said diagonal structural path being formed non-perpendicular to said top surface and said bottom surface.

2. The method of forming an integrated circuit structure according to claim 1, further comprising forming multiple ones of said diagonal structural path to form diagonal structural paths,
    adjacent ones of said diagonal structural paths forming a triangular load-bearing structure with one of said top surface and said bottom surface.

3. The method of forming an integrated circuit structure according to claim 2, said triangular load-bearing structure preventing said laminated structure of insulator layers from warping and delaminating.

4. The method of forming an integrated circuit structure according to claim 1, within each of said via openings, a second opening portion is formed to be overlapped with, and offset from a first opening portion.

5. The method of forming an integrated circuit structure according to claim 1, said insulator layers being formed parallel to said top surface and said bottom surface.

6. The method of forming an integrated circuit structure according to claim 1, further comprising connecting a flip chip to one of said bottom surface and said top surface.

7. A method of forming an integrated circuit structure comprising:
    forming a plurality of via openings by forming, for each of said plurality of via openings, a first opening portion in an insulator layer, said first opening portion extending fully through said insulator layer, each of said plurality of via openings being formed to have three unequal perpendicular dimensions comprising a depth dimension equal to a thickness of said insulator layer, a width dimension greater than said depth dimension, and a length dimension greater than said width dimension;
    forming, for each of said plurality of via openings, a second opening portion to extend partially through said insulator layer, said length dimension of said second opening portion being formed greater than said length dimension of said first opening portion, and said width dimension of said second opening portion being formed greater than said width dimension of said first opening portion;
    forming conductive via material within said plurality of via openings; and
    forming a laminated structure of insulator layers on said insulator layer, said forming of said laminated structure of insulator layers comprising:
        successively forming said insulator layers on one another;
        repeating said forming of said first opening portion and said forming of said second opening portion to successively form via openings in each said insulator layers;
        positioning corresponding ones of via openings of adjacent ones of said insulator layers to partially overlap each other; and
        repeating said forming of said conductive via material in said plurality of via openings,
    said laminated structure of insulator layers being formed to have a top surface and a bottom surface opposite said top surface, said insulator layers being formed between said top surface and said bottom surface of said laminated structure of insulator layers, said repeating of said forming of said conductive via material in said plurality of via openings electrically connecting said conductive via material within said corresponding ones of said plurality of via openings to form continuous electrical via paths through said insulator layers between said top surface and said bottom surface of said laminated structure of insulator layers, said positioning of said corresponding ones of via openings within each of said continuous electrical via paths causing said forming of said conductive via material to form a diagonal structural path of said conductive via material through said laminated structure of insulator layers, and said diagonal structural path being formed non-perpendicular to said top surface and said bottom surface.

8. The method of forming an integrated circuit structure according to claim 7, further comprising forming multiple ones of said diagonal structural path to form diagonal structural paths, adjacent ones of said diagonal structural paths forming a triangular load-bearing structure with one of said top surface and said bottom surface.

9. The method of forming an integrated circuit structure according to claim 8, said triangular load-bearing structure preventing said laminated structure from warping and delaminating.

10. The method of forming an integrated circuit structure according to claim 7, within each of said plurality of via openings, said second opening portion being formed to be overlapped with, and offset from said first opening portion.

11. The method of forming an integrated circuit structure according to claim 7, said insulator layers being formed parallel to said top surface and said bottom surface.

12. The method of forming an integrated circuit structure according to claim 7, further comprising connecting a flip chip to one of said bottom surface and said top surface.

13. A method of forming an integrated circuit structure comprising:

forming via openings in an insulator layer;

forming conductive via material within said via openings; and forming a laminated structure of insulator layers on said insulator layer, said forming of said laminated structure of insulator layers comprising:

successively forming said insulator layers on one another;

repeating said forming of said via openings in each said insulator layers;

positioning corresponding ones of via openings of adjacent ones of said insulator layers to partially overlap each other; and repeating said forming of said conductive via material in said via openings, said laminated structure of insulator layers being formed to have a top surface and a bottom surface opposite said top surface, said insulator layers being formed between said top surface and said bottom surface of said laminated structure of insulator layers, said repeating of said forming of said conductive via material in said via openings electrically connecting said conductive via material within said corresponding ones of said via openings to form continuous electrical via paths through said insulator layers between said top surface and said bottom surface of said laminated structure of insulator layers, said positioning of said corresponding ones of via openings within each of said continuous electrical via paths causing said forming of said conductive via material to form a diagonal structural path of said conductive via material through said laminated structure of insulator layers.

14. The method of forming an integrated circuit structure according to claim 13, further comprising forming multiple ones of said diagonal structural path to form diagonal structural paths, adjacent ones of said diagonal structural paths forming a triangular load-bearing structure with one of said top surface and said bottom surface.

15. The method of forming an integrated circuit structure according to claim 14, said triangular load-bearing structure preventing said laminated structure from warping and delaminating.

16. The method of forming an integrated circuit structure according to claim 13, within each of said via openings, a second opening portion is formed to be overlapped with, and offset from a first opening portion.

17. The method of forming an integrated circuit structure according to claim 13, said insulator layers being formed parallel to said top surface and said bottom surface.

18. The method of forming an integrated circuit structure according to claim 13, further comprising connecting a flip chip to one of said bottom surface and said top surface.

* * * * *